US006563711B1

(12) United States Patent
Daly et al.

(10) Patent No.: US 6,563,711 B1
(45) Date of Patent: May 13, 2003

(54) ACTIVE NOISE CANCELLATION ARRANGEMENT WITH HEAT DISSIPATION

(75) Inventors: Paul D. Daly, Troy, MI (US); John F. Astorino, Livonia, MI (US); Charles R. Cook, Jr., Rochester Hills, MI (US)

(73) Assignee: Siemens Canada Limited, Tilbury (CA)

( * ) Notice: Subject to any disclaimer, the term of this patent is extended or adjusted under 35 U.S.C. 154(b) by 28 days.

(21) Appl. No.: 09/826,030

(22) Filed: Apr. 4, 2001

Related U.S. Application Data

(60) Provisional application No. 60/209,752, filed on Jun. 6, 2000.

(51) Int. Cl.[7] .................................................. H05K 7/20

(52) U.S. Cl. ........................ 361/704; 361/702; 361/707; 165/80.3; 123/198 E; 73/118.2

(58) Field of Search ................................ 361/689, 690, 361/691, 694–697, 702, 704–710, 717–720, 749, 807, 809, 810, 826, 827; 165/80.3, 80.6, 104.33, 185; 174/16.3, 35 R; 123/198 E, 184.21, 41.31, 41.56, 488, 494; 73/118.2

(56) References Cited

U.S. PATENT DOCUMENTS 3,996,914 A * 12/1976 Crall et al. ............. 123/198 E
5,097,923 A * 3/1992 Ziegler et al. .............. 181/206
5,207,186 A * 5/1993 Okita ...................... 123/41.31
5,713,322 A * 2/1998 Mausner et al. ....... 123/184.21
5,715,140 A * 2/1998 Sinkunas et al. ........... 361/690
5,988,119 A 11/1999 Trublowski et al.
6,171,380 B1 * 1/2001 Wood et al. .................. 96/386
6,212,073 B1 * 4/2001 Yamaguchi ................. 361/705

FOREIGN PATENT DOCUMENTS

EP 0884471 A2 12/1998
JP 407064568 A * 3/1995 ......... G10K/11/178
JP 09126076 5/1997
JP 09151817 6/1997
JP 09319376 12/1997
JP 410220891 A * 8/1998 ............. F25B/9/00

* cited by examiner

*Primary Examiner*—Darren Schuberg
*Assistant Examiner*—Michael Datskovsky

(57) ABSTRACT

A vehicle air intake system includes a noise cancellation assembly. A cooling member is provided at least partially within an air passageway for dissipating heat within an electronics module portion of the noise cancellation assembly. The cooling member preferably is a brass material insert that is supported at least partially within an air passageway by a housing that supports components of the noise cancellation assembly. A connecting member that thermally couples the electronics module to the cooling member also operates to secure the electronics module to the housing in one example embodiment.

18 Claims, 2 Drawing Sheets

ACTIVE NOISE CANCELLATION ARRANGEMENT WITH HEAT DISSIPATION

CROSS-REFERENCE TO RELATED APPLICATIONS

This application claims priority to U.S. Provisional Application No. 60/209,752, which was filed on Jun. 6, 2000.

BACKGROUND OF THE INVENTION

This invention generally relates to noise cancellation arrangements in vehicle air intake systems. More particularly, this invention relates to a heat dissipation arrangement for a noise cancellation system.

Internal combustion engines include air induction systems for conducting air to the engine. Engine noise typically is propagated through the air induction system, which is undesirable. Noise attenuation mechanisms have been installed within the air induction systems to reduce such noises. Typical noise attenuation mechanisms include a speaker, a sound detector such as a microphone and a signal generator. Various other components are often used to reduce noise generated at the air induction system.

The noise attenuation system signal generator is often part of a printed circuit board that is used to control operation of the noise attenuation system components. One problem associated with such arrangements is a tendency for heat build-up at the circuit components. There is a need for an effective way to dissipate heat in the noise attenuation system.

This invention addresses that need in an efficient manner, which takes advantage of the characteristics of the air induction system.

SUMMARY OF THE INVENTION

In general terms, this invention is a noise attenuation assembly for use in a vehicle air intake arrangement. An assembly designed according to this invention includes a housing that at least partially defines an air passageway. An electronics module is supported by the housing. A metal cooling member is supported by the housing at least partially in the air passageway and coupled with the electronics module such that heat in the electronics module is dissipated by the cooling member.

In one example, the cooling member is made of brass.

In one example, the cooling member includes a body portion having an opening through the body portion and a plurality of ribs that extend radially outwardly from the body portion.

A method of this invention for controlling the temperature of an electronics module in a noise attenuation device that is used in a vehicle air intake system includes several steps. A cooling member is supported on a portion of a housing that at least partially defines an air passageway such that the cooling member is at least partially within the air passageway. The cooling member is then coupled with the electronics module of the noise attenuation device to thereby allow heat in the electronics module to be dissipated by the cooling member.

In one example, the cooling member is supported on the housing by hot pressing at least a portion of the cooling member into a portion of the housing.

The various features and advantages of this invention will become apparent to those skilled in the art from the following detailed description of the currently preferred embodiment. The drawings that accompany the detailed description can be briefly described as follows.

DETAILED DESCRIPTION OF A PREFERRED EMBODIMENT

Figure 1:
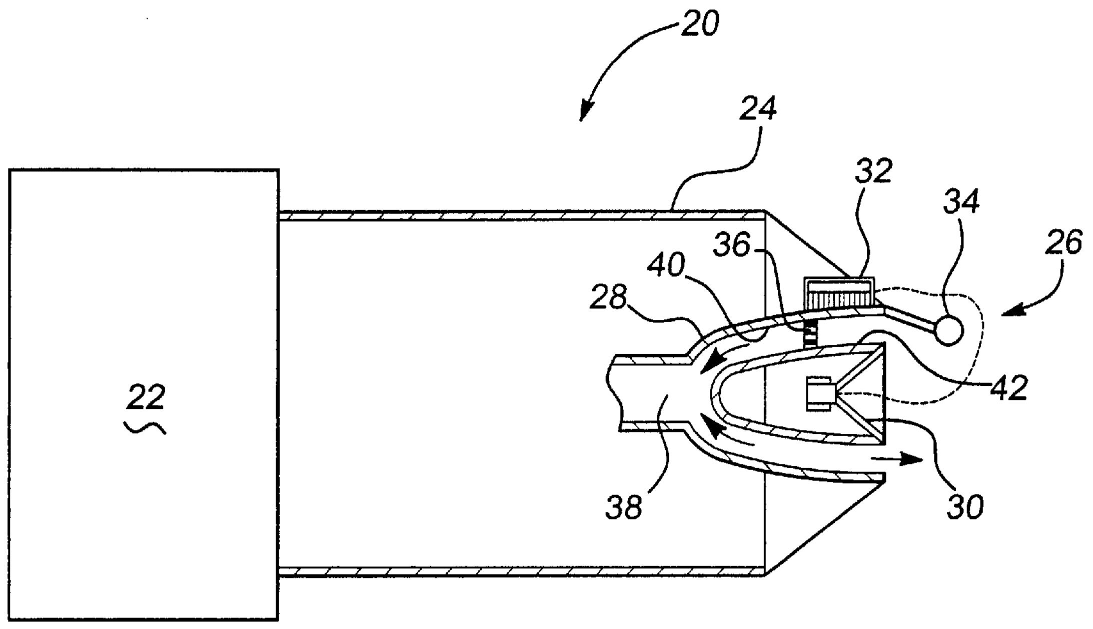
FIG. 1 schematically illustrates a noise attenuation system designed according to this invention.

A vehicle air intake assembly 20 is used to provide air to a vehicle engine 22. An air intake housing 24 supports a noise attenuation device 26 near an inlet portion of the air intake system.

The noise attenuation system 26 includes a housing portion 28 that supports a speaker 30 in the air intake arrangement. An electronics module 32 and noise detector 34 are also part of the noise attenuation device 26. Noise attenuation devices are known and the function of the device 26 need not be elaborated on in this description.

A cooling member 36 is supported at least partially within an air passageway 38 defined by the housing portion 28. The cooling member 36 is preferably made from a metal material. Brass is the preferred material. Other example materials that are useful with this invention include steel or aluminum. Brass is preferred because of its expansion and contraction characteristics compared to other metals.

The cooling member 36 preferably is at least partially received into a portion of the housing 28. In one example, a hot press installation method is used. The cooling member 36 is heated and then pressed against the appropriate portion of the housing 28 so that the cooling member 36 is at least partially embedded into the wall of the housing. Hot press methodology is known in the art. Another example installation method includes a cold press.

A variety of ways of securing the cooling member 36 to the housing at least partially within the air passageway 38 may be used within the scope of this invention. Those who have the benefit of this description will be able to choose the best installation method for their particular situation.

Locating cooling member 36 at least partially within the air passageway 38 provides a significant advantage in that the air flow through the passageway, which is required for engine operation, also serves a cooling function. Having the cooling member 36 at least partially within the air passageway 38 allows for a much smaller cooling member 36 to be utilized. Smaller cooling members reduces cost because the amount of metal material required is reduced. Cost savings are an important issue in automotive applications.

Figure 3:
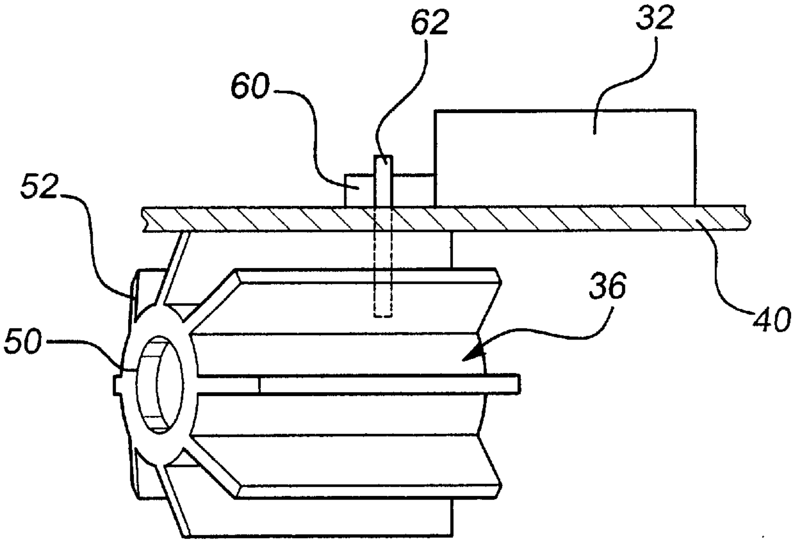
FIG. 3 schematically illustrates selected portions of the embodiment of FIG. 1.
Figure 4:
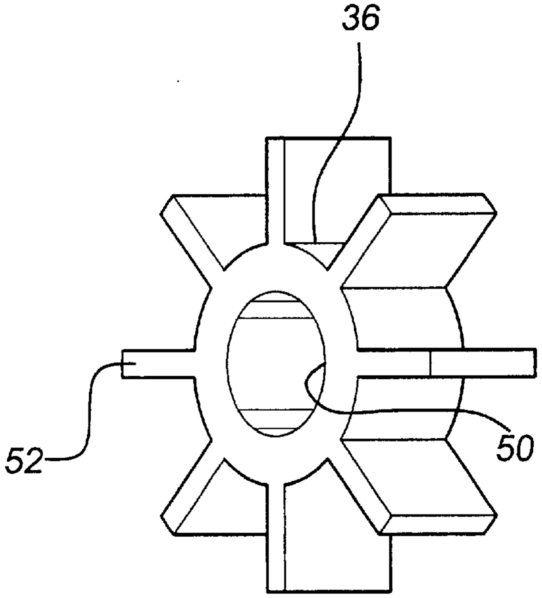
FIG. 4 illustrates an example insert member designed according to this invention.
Figure 5:
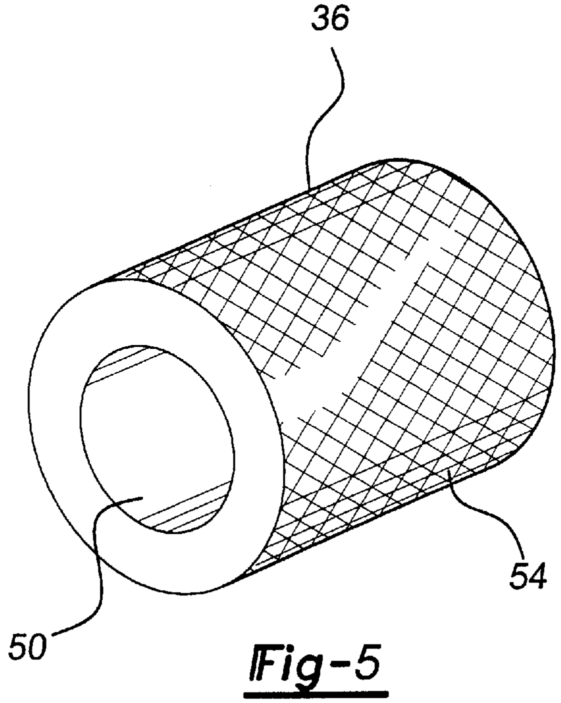
FIG. 5 illustrates another example insert member designed according to this invention.

The cooling member 36 can take a variety of forms. Examples are shown in FIGS. 3, 4 and 5. The examples of FIGS. 3 and 4 each include a body portion having an opening 50 extending through the body portion. A plurality of rib members 52 extend away from the body portion in a radially outward direction. At least one of the rib portions 52 preferably is embedded into a portion of the housing wall 30 using the hot press method, for example.

Figure 2:
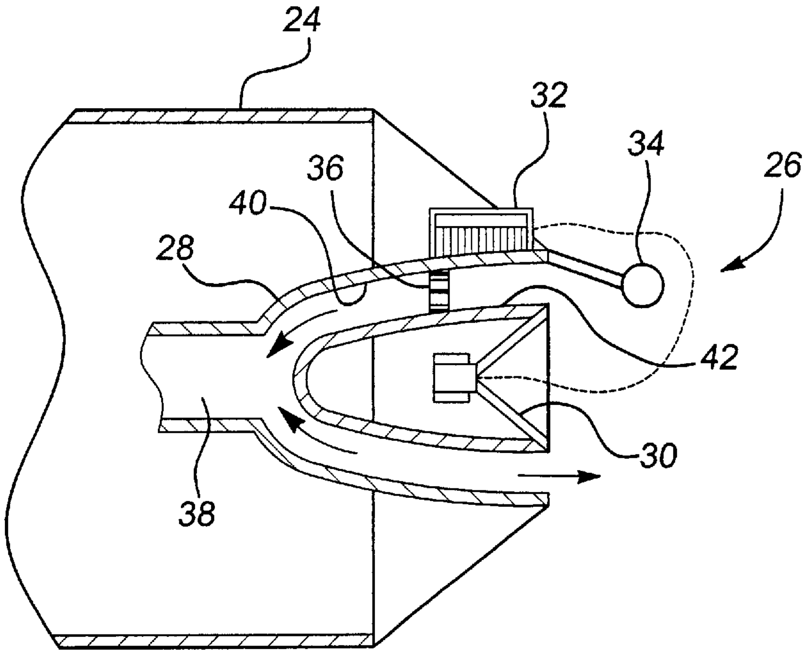
FIG. 2 is an enlarged view showing somewhat more detail of a portion of the embodiment of FIG. 1.

In the example of FIG. 2, the cooling member 36 extends across an entire portion of the air passageway 38 between inner walls 40 and 42 of the air passageway. In situations where the cooling member 36 extends across an entire portion of the air passageway, the cooling member must include sufficient openings or passageways to allow air flow as needed.

The example cooling member of FIG. 5 does not have ribs as the examples of FIGS. 3 and 4. Instead, an outer surface 54 on the body portion of the cooling member is knurled. A knurled outer surface 54 provides for a better adhesion between the cooling member and an interior surface on the housing wall within an air passageway compared to a smooth outer surface.

The cooling member 36 of this invention is primarily intended to dissipate heat that is generated within the electronics module 32. Electronics modules that are used for controlling noise cancellation systems typically include printed circuit boards that have circuit elements that tend to heat up during operation. The cooling member 36 preferably is coupled with the electronics module so that heat within the electronics 32 is dissipated through the cooling member 36.

In one example, the electronics module 32 includes a printed circuit board that has a flag portion 60. A connecting member 62 extends through an opening in the flag portion 60, through a portion of the housing wall 40 and makes contact with the cooling member 36 which allows for thermal conduction between the electronics module 32 and the cooling member 36. In one example, a pin is used as the connecting member 62. In another example, a clip is used as the connecting member 62.

Another advantage of this invention is that the connecting member 62 not only thermally couples the cooling member 36 with the electronics module 32 but also operates to mount the electronics module 32 onto the housing portion 28.

This invention provides a compact, cost effective arrangement for dissipating heat in an electronics module within a noise cancellation arrangement in a vehicle air intake system.

The preceding description gives example implementations of this invention. Variations and modifications may become apparent to those skilled in the art but do not necessarily depart from the essence of this invention. The scope of legal protection given to this invention can only be determined by studying the following claims.

We claim:

1. A noise attenuation assembly for use in a vehicle air intake arrangement, comprising:

a housing that at least partially defines an air passageway;

an electronics module supported by the housing; and a metal cooling member that includes a generally cylindrical body portion and a plurality of ribs extending radially outward from the body portion, the cooling member being supported by the housing at least partially in the air passageway and coupled with the electronics module such that heat in the electronics module is dissipated by the cooling member.

2. The assembly of claim 1, wherein the cooling member comprises brass.

3. The assembly of claim 1, wherein to cooling member body portion includes an opening extending through the body portion and wherein the opening is aligned with an airflow pat through the air passageway.

4. The assembly of claim 1, wherein the cooling member is at least partially received into a portion of the housing.

5. The assembly of claim 1, wherein the cooling member extends across the entire air passageway.

6. The assembly of claim 1, wherein the electronics module includes a printed circuit board and a connector portion and including a connecting member coupling the connector portion to the cooling member.

7. The assembly of claim 6, wherein the connecting member extends through an opening in the connector portion and through a portion of the housing such that the connecting member secures the printed circuit board to the housing.

8. A noise attenuation assembly for use in a vehicle air intake arrangement comprising:

a housing tat at least partially defines an air passageway;

an electronics module supported by the housing; and a metal cooling member that includes a body portion having an exterior surface that is knurled, the cooling member being supported by the housing at least partially in to air passageway and coupled with the electronics module such that heat in the electronics module is dissipated by the cooling member.

9. The assembly of claim 8, wherein the cooling member comprises brass.

10. The assembly of claim 8, wherein the cooling member body portion includes an opening extending through the body portion and wherein die opening is aligned with an airflow path through the air passageway.

11. The assembly of claim 8, wherein the cooling member is at least partially received into a portion of to housing.

12. The assembly of claim 8, wherein the electronics module includes a printed circuit board and a connector portion and including a connecting member coupling the connector portion to the cooling member.

13. The assembly of claim 12, wherein the connecting member extends through an opening in the connector portion and through a portion of the housing such that the connecting member secures the printed circuit board to the housing.

14. The assembly of claim 8, wherein the cooling member extends across the entire air passageway while still allowing airflow past the cooling member.

15. The assembly of claim 8, wherein the cooling member extends only across a portion of the air passageway.

16. A noise attenuation assembly for use in a vehicle air intake arrangement, comprising:

a housing that at least partially defines an air passageway;

an electronics module supported by the housing; and a metal cooling member that includes a body portion having an opening that extends through the body portion and is aligned with an air flow path through the air passage way and the metal cooling member including a plurality of ribs extending radially outward from the body portion, the cooling member being supported by the housing at least partially in the air passageway and coupled with the electronics module such that heat in the electronics module is dissipated by the cooling member.

17. A noise attenuation assembly for use in a vehicle air intake arrangement, comprising:

a housing that at least partially defines an air passageway;

an electronics module supported by the housing; and a metal cooling member that extends across the entire passageway and includes a body portion and a plurality of ribs extending radially outward from the body portion, the cooling member being supported by the housing at least partially in the air passageway and coupled with the electronics module such that heat in the electronics module is dissipated by the cooling member.

18. A noise attenuation assembly for use in a vehicle air intake arrangement, comprising:

a housing that at least partially defines an air passageway;

an electronics module supported by the housing, the electronics module includes a printed circuit board and a connector portion;

a metal cooling member that includes a body portion and a plurality of ribs extending radially outward from the body portion, the cooling member being supported by the housing at least partially in the air passageway and coupled with the electronics module such that heat in the electronics module is dissipated by the cooling member; and a connecting member coupling the connector portion to the cooling member.

* * * * *